(12) United States Patent
Wang et al.

(10) Patent No.: US 10,573,668 B2
(45) Date of Patent: Feb. 25, 2020

(54) COLOR FILTER SUBSTRATE, ARRAY SUBSTRATE, AND DISPLAY APPARATUS

(71) Applicants: BOE Technology Group Co., Ltd., Beijing (CN); Beijing BOE Display Technology Co., Ltd., Beijing (CN)

(72) Inventors: Meili Wang, Beijing (CN); Yun Qiu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/677,308

(22) Filed: Aug. 15, 2017

(65) Prior Publication Data

US 2018/0190673 A1 Jul. 5, 2018

(30) Foreign Application Priority Data

Jan. 3, 2017 (CN) .......................... 2017 1 0001424

(51) Int. Cl.
*H01L 27/12* (2006.01)
*G02B 5/18* (2006.01)
(Continued)

(52) U.S. Cl.
CPC .......... *H01L 27/124* (2013.01); *G02B 5/1819* (2013.01); *G02B 5/1866* (2013.01);
(Continued)

(58) Field of Classification Search
CPC ... H01L 27/124; H01L 27/1218; H01L 33/52; G02B 5/1819; G02B 5/1866; G02B 5/28;
(Continued)

(56) References Cited

U.S. PATENT DOCUMENTS

| 8,749,736 | B2 | 6/2014 | Yoon |
| 9,519,182 | B2 | 12/2016 | Son et al. |
| 9,547,107 | B2 * | 1/2017 | Guo ...................... G02B 5/008 |
| 10,290,684 | B2 | 5/2019 | Zhang et al. |

(Continued)

FOREIGN PATENT DOCUMENTS

| CN | 102103223 A | 6/2011 |
| CN | 103460085 A | 12/2013 |

(Continued)

OTHER PUBLICATIONS

Office Action, including Search Report, for Chinese Patent Application No. 201710001424.3, dated Jul. 31, 2019, 25 pages.

*Primary Examiner* — Ratisha Mehta
(74) *Attorney, Agent, or Firm* — Westman, Champlin & Koehler, P.A.

(57) ABSTRACT

Embodiments of this invention relate to a color filter substrate, an array substrate, and a display apparatus. this color filter substrate comprises a substrate; and a color filter layer located on the substrate, wherein the color filter layer comprises a transmissive grating, the transmissive grating comprises a medium array located on the substrate; and a metal layer located on the top surface and the side wall of the medium array, and may comprise a first grating which transmits red light, a second grating which transmits green light, and a third grating which transmits blue light. This array substrate comprises: a substrate; a thin film transistor located on the substrate; and a color filter layer, which is located on the substrate and is provided near the thin film transistor in a direction in parallel with the surface of the substrate, wherein the color filter layer comprises a transmissive grating, and the transmissive grating comprises: a medium array located on the substrate; and a metal layer located on the top surface and the side wall of the medium array. This display apparatus comprises this color filter substrate or this array substrate.

18 Claims, 5 Drawing Sheets

(51) Int. Cl.
*G02B 5/28* (2006.01)
*H01L 33/52* (2010.01)
*G02F 1/1335* (2006.01)
*G02F 1/1362* (2006.01)

(52) U.S. Cl.
CPC ............ *G02B 5/1885* (2013.01); *G02B 5/28* (2013.01); *G02F 1/133514* (2013.01); *H01L 27/1218* (2013.01); *H01L 33/52* (2013.01); *G02F 2001/133521* (2013.01); *G02F 2001/136222* (2013.01); *G02F 2201/30* (2013.01); *G02F 2201/305* (2013.01)

(58) Field of Classification Search
CPC ............ G02B 5/1885; G02F 1/133514; G02F 2001/133521
See application file for complete search history.

(56) References Cited

U.S. PATENT DOCUMENTS

| | | | |
|---|---|---|---|
| 2008/0121781 A1* | 5/2008 | Boettiger | G02B 5/1866 250/208.1 |
| 2011/0149217 A1* | 6/2011 | Yoon | G02B 5/008 349/106 |
| 2011/0285942 A1* | 11/2011 | Guo | G02B 5/008 349/96 |
| 2014/0071532 A1* | 3/2014 | Ye | G02B 5/204 359/568 |
| 2014/0268332 A1* | 9/2014 | Guo | G02B 5/008 359/487.01 |
| 2016/0274281 A1* | 9/2016 | Lutolf | G02B 5/1852 |

FOREIGN PATENT DOCUMENTS

| | | |
|---|---|---|
| CN | 105607371 A | 5/2016 |
| CN | 106200090 A | 12/2016 |
| WO | 2012/079239 A1 | 6/2012 |

\* cited by examiner

COLOR FILTER SUBSTRATE, ARRAY SUBSTRATE, AND DISPLAY APPARATUS

CROSS-REFERENCE TO A RELATED APPLICATION

This application claims priority to Chinese Patent Application No. 201710001424.3, filed on Jan. 3, 2017, the content of which is incorporated herein by reference in entirety.

TECHNICAL FIELD

Embodiments of this invention relate to the technical field of display, and particularly to a color filter substrate, an array substrate, and a display apparatus.

BACKGROUND ART

Full-color display of a conventional display apparatus is mainly achieved by obtaining three primary colors, red (R), green (G), and blue (B), by filtration with a color filter. Particularly, a pigment or a dye is used to absorb lights having unwanted wavelengths, and lights having desired wavelengths are selectively transmitted, so that the transmission of three primary colors R, G, and B and color display are achieved. A conventional manufacture process of a color filter needs to prepare three layers of color filters for R, G, and B, respectively. This process has a long period and RGB ink materials used will result in environmental pollution.

SUMMARY OF THE INVENTION

In a first aspect of this disclosure, there is provided a color filter substrate, comprising: a substrate; and a color filter layer located on the substrate,
wherein the color filter layer comprises a transmissive grating,
and the transmissive grating comprises: a medium array located on the substrate; and a metal layer located on a top surface and a side wall of the medium array.

In one embodiment, the medium array comprises PMMA or silicon oxide.

In one embodiment, the metal layer comprises Al, Au, or Ag.

In one embodiment, the medium array of the transmissive grating has a grating period L:

$$L = \frac{\lambda}{((\varepsilon_m * \varepsilon_d)/(\varepsilon_m + \varepsilon_d))^{\frac{1}{2}}}$$

wherein $\varepsilon_m$ is the dielectric constant of the metal, $\varepsilon_d$ is the dielectric constant of the environment outside the metal, and $\lambda$ is the wavelength of transmitted light.

In one embodiment, the transmissive grating comprises a first grating which transmits red light, a second grating which transmits green light, and a third grating which transmits blue light, wherein the first grating has a grating period in a range of 360-436 nm; the second grating has a grating period in a range of 288-331 nm; and the third grating has a grating period in a range of 262-276 nm.

In a second aspect of this disclosure, there is further provided an array substrate, comprising: a substrate; a thin film transistor located on the substrate; and a color filter layer, which is located on the substrate and is provided near the thin film transistor in a direction in parallel with the surface of the substrate,
wherein the color filter layer comprises a transmissive grating,
and the transmissive grating comprises: a medium array located on the substrate; and a metal layer located on a top surface and a side wall of the medium array.

In one embodiment, the medium array comprises PMMA or silicon oxide.

In one embodiment, the metal layer comprises Al, Au, or Ag.

In one embodiment, the medium array of the transmissive grating has a grating period L:

$$L = \frac{\lambda}{((\varepsilon_m * \varepsilon_d)/(\varepsilon_m + \varepsilon_d))^{\frac{1}{2}}}$$

wherein $\varepsilon_m$ is the dielectric constant of a metal, $\varepsilon_d$ is the dielectric constant of the environment outside the metal, and $\lambda$ is the wavelength of transmitted light.

In one embodiment, the transmissive grating comprises a first grating which transmits red light, a second grating which transmits green light, and a third grating which transmits blue light, wherein the first grating has a grating period in a range of 360-436 nm; the second grating has a grating period in a range of 288-331 nm; and the third grating has a grating period in a range of 262-276 nm.

In one embodiment, the thin film transistor and the transmissive grating are provided in the same layer.

In one embodiment, the array substrate further comprises: a passivating layer, which covers the thin film transistor and the transmissive grating; and a transparent electrode located on the passivating layer.

In one embodiment, the thin film transistor and the transmissive grating are not provided in the same layer.

In one embodiment, the array substrate further comprises: a passivating layer, which covers the thin film transistor and the substrate, wherein the transmissive grating is located on the passivating layer; a planarizing layer located on the passivating layer; and a transparent electrode located on the planarizing layer.

In one embodiment, in a grating period, the sum of the width of the medium and the thickness of the metal layer on the side wall constitutes 50% or more of the whole period.

In one embodiment, the total thickness of the medium and the metal layer on the top surface in the transmissive grating is in a range of 100 nm-200 nm.

In a third aspect of this disclosure, there is provided a display apparatus, comprising: any color filter substrate described in the first aspect of this disclosure.

In a fourth aspect of this disclosure, there is provided a display apparatus, comprising: any array substrate described in the second aspect of this disclosure.

DESCRIPTION OF DRAWINGS

Accompanying drawings described herein are only used for the purpose of illustration of selected embodiments, are not all possible embodiments, and are not intended to limit the scope of this application, in which.

Throughout respective views of these accompanying drawings, corresponding reference numerals indicate corresponding members or features.

DESCRIPTION OF EMBODIMENTS

Adaptable further aspects and scopes become conspicuous from the description provided herein. It is to be understood that respective aspects of this application may be implemented alone or in combination with one or more other aspects. It is also to be understood that the description and specific embodiments herein are only for the purpose of illustration and are not intended to limit the scope of this application.

It is to be first indicated that singular forms of the words used herein and the appended claims comprise plural forms, unless the context clearly dictates otherwise, vice versa. Therefore, when reference is made to a singular form of a term, a corresponding plural form of this term is typically encompassed. Similarly, the words "comprise" and "include" will be explained to be inclusive but not exclusive. Likewise, the terms "comprise" and "or" should be explained to be inclusive, unless such explanation is clearly inhibited herein. Where the term "example" is used herein, particularly where it lies behind a group of terms, said "example" is merely exemplary and illustrative, and should not be considered to be exclusive or extensive.

Furthermore, in accompanying drawings, the thickness and the area of respective layers are exaggerated for the purpose of clarity. It is to be understood that when a layer, a region, or a component is referred to as being "on" another part, this means that it is directly on that part or another component may be present therebetween. On the contrary, when a certain component is referred to as being "directly" on another component, this means that there is not any other component present therebetween.

Exemplary embodiments will now be described more fully with reference to accompanying drawings.

Figure 1:
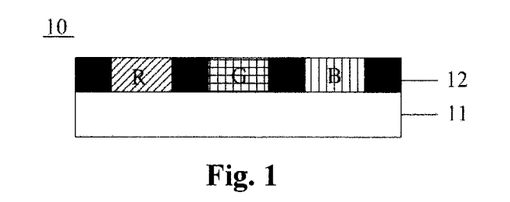
FIG. 1 schematically shows a sectional view of a conventional color filter.

FIG. 1 schematically shows a sectional view of a conventional color filter 10. As shown in FIG. 1, the color filter 10 comprises a glass substrate 11 and a color filter layer 12 located on the glass substrate 11, and the color filter layer 12 comprises a red color filter (R), a green color filter (G), a blue color filter (B), and black matrices located on between respective color filters. A conventional manufacture process of a color filter needs to prepare three layers of color filters for R, G, and B, respectively. This process has a long period and RGB ink materials used will result in environmental pollution.

Embodiments of this invention provides a color filter substrate, an array substrate, and a display apparatus, which can achieve the simplification of the manufacture process of color filters, the reduction of the production cost, and the reduction of environmental pollution by ink.

In an embodiment described herein, the use of a transmissive grating instead of a conventional color filter allows white light to be transmitted through three transmissive gratings having different grating periods to obtain three primary colors R, G, and B, so that full-color display is achieved. Therefore, the color filter substrate, the array substrate, and the display apparatus provided in embodiments of this disclosure can achieve the simplification of the manufacture process of color filters, the reduction of the production cost, and the reduction of environmental pollution by ink.

In an embodiment described herein, there is provided a color filter substrate, and this color filter substrate may be used in a display apparatus. When this color filter substrate is used for a display apparatus, a conventional color filter may be replaced by a transmissive grating to achieve the transmission of three primary colors R, G, and B and achieve full-color display, so as to simplify the manufacture process of color filters, reduce the production cost, and reduce environmental pollution by ink. An exemplary color filter substrate provided in an embodiment of this disclosure will now be described in detail with reference to FIG. 2.

Figure 2:
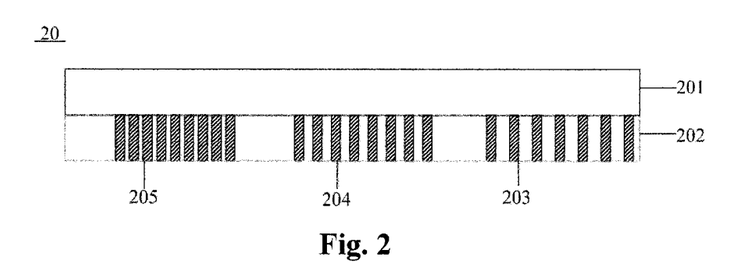
FIG. 2 schematically shows a sectional view of an exemplary color filter substrate provided in an embodiment of this disclosure.

FIG. 2 schematically shows a sectional view of an exemplary color filter substrate 20 provided in an embodiment of this disclosure. As shown in FIG. 2, this color filter substrate 20 comprises a substrate 201 and a color filter layer 202 provided on the substrate 201. In this embodiment, the color filter layer 202 comprises a transmissive grating. Particularly, color filter layer 202 comprises a first transmissive grating 203, a second transmissive grating 204, and a third transmissive grating 205. The first transmissive grating 203 can transmit the component of red light in white light, wherein the wavelength of the red light is in a range of 620-750 nm; the second transmissive grating 204 can transmit the component of green light in white light, wherein the wavelength of the green light is in a range of 495-570 nm; and the third transmissive grating 205 can transmit the component of blue light in white light, wherein the wavelength of the blue light is in a range of 450-475 nm.

Figure 3:
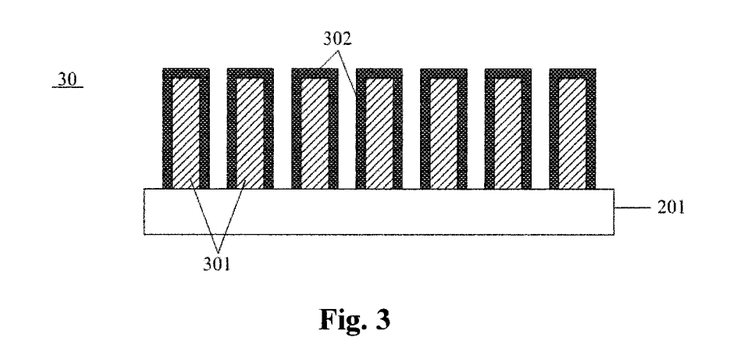
FIG. 3 schematically shows a sectional view of an exemplary transmissive grating provided in an embodiment of this disclosure.

In this embodiment, a conventional color filter is replaced by a transmissive grating to transmit three primary colors R, G, and B, so that full-color display is achieved. FIG. 3 schematically shows a sectional view of an exemplary transmissive grating 30 provided in an embodiment of this disclosure. As shown in FIG. 3, the transmissive grating 30 comprises a medium array 301 located on the substrate 201 and a metal layer 302 located on the top surface and the side wall of the medium array 301.

In one exemplary embodiment, the substrate may comprise a transparent material such as glass, etc.

In one exemplary embodiment, the medium array 301 may comprise PMMA or silicon oxide.

In one exemplary embodiment, the metal layer 302 comprises Al, Au, or Ag.

In one exemplary embodiment, the thickness of the metal layer 302 is less than 50 nm.

In one exemplary embodiment, the method for preparing a medium array 301 includes but is not limited to a nanoimprint process, a printing process, a photolithographic process, etc.

In one exemplary embodiment, the metal layer 302 is deposited on the top surface and the side wall of the medium array 301 by a deposition method. The deposition method includes but is not limited to magnetron sputtering, thermal evaporation, electron beam evaporation, atomic layer deposition, etc.

With respect to traditional optics, light will be reflected when irradiated onto the surface of metal, and fails to transmit the metal. However, when there is a sub-wavelength aperture on the metal and the aperture size is far less than the incident wavelength, this type of photoelectric devices will break through the restriction of the traditional optical diffraction limit and thus the extraordinary transmission phenomenon occurs. The principle of the occurrence of the extraordinary transmission phenomenon is that when incident light is radiated onto a surface with metal apertures periodically arranged, the resonance of light having a specific wavelength in the incident light with plasma on the metal surface occurs, and a part of the energy of the light wave will be converted to the energy of the vibration of free electrons, so that the attenuation of the reflectance index is exhibited and plasma with the energy enhanced passes through metal apertures to achieve transmission. In the transmissive grating 30 shown in FIG. 3, the thickness of the metal layer 302 is less than 50 nm, so that the coupling resonance of the incident light with the wave of plasma on the metal surface occurs to achieve a narrow-waveband transmission.

In this disclosure, the side wall of the medium array is coated with the metal layer to act as a metal grating. The structure, in which the metal layer on the top surface and the metal layer on the side wall are present simultaneously, ensures that the above described coupling resonance of the incident light with the wave of plasma on the metal surface can occur. If the metal layer on the side wall is not present in the grating, it fails to exert a good function of filtering.

the wavelength of the plasmon resonance λ is mainly controlled by the grating period L. In this embodiment, the grating period L is the period of the grating of the medium array. See the equation $\lambda = L((\varepsilon_m * \varepsilon_d)/(\varepsilon_m + \varepsilon_d))^{1/2}$, wherein $\varepsilon_m$ is the dielectric constant of the metal, and $\varepsilon_d$ is the dielectric constant of the environment outside the metal. After the materials are determined in the process of preparation, $\varepsilon_m$ and $\varepsilon_d$ are constants, and λ and L are in a linear relationship. According to the equation described above, the filtration of different wavelengths and the transmission of different colors may be performed on the incident light by designing the period of the grating. Particularly, by designing the grating period, three primary colors R, G, and B are filtered through, so that full-color display may be achieved.

Preferably, in a grating period, the sum of a medium and the metal layer constitutes 50% or more of the whole period, such as up to 90%.

Preferably, the total thickness of the medium and the metal layer on the top surface in the transmissive grating is in a range of 100 nm-200 nm.

In one exemplary embodiment, in FIG. 2, the grating period of the first transmissive grating 203 is in a range of 360-436 nm; the grating period of the second transmissive grating 204 is in a range of 288-331 nm; the grating period of the third transmissive grating 205 is in a range of 262-276 nm.

It can be understood that the structure of the transmissive grating is not limited to those exemplarily listed herein, as long as light with desirable wavelengths in white light can be filtered through. Particularly, red light, green light, and blue light in white light are filtered through.

It is to be indicated that the structure of the transmissive grating shown in FIG. 3 is also suitable for other embodiments described herein, and the description thereof is not repeated in other embodiments.

In an embodiment described herein, there is further provided a display apparatus, and this display apparatus can achieve the simplification of the manufacture process steps of color filters, the reduction of the production cost, and the reduction of environmental pollution by ink Exemplary display apparatuses provided in embodiments of this disclosure will now be described in detail with reference to FIGS. 4 and 5.

Figure 4:
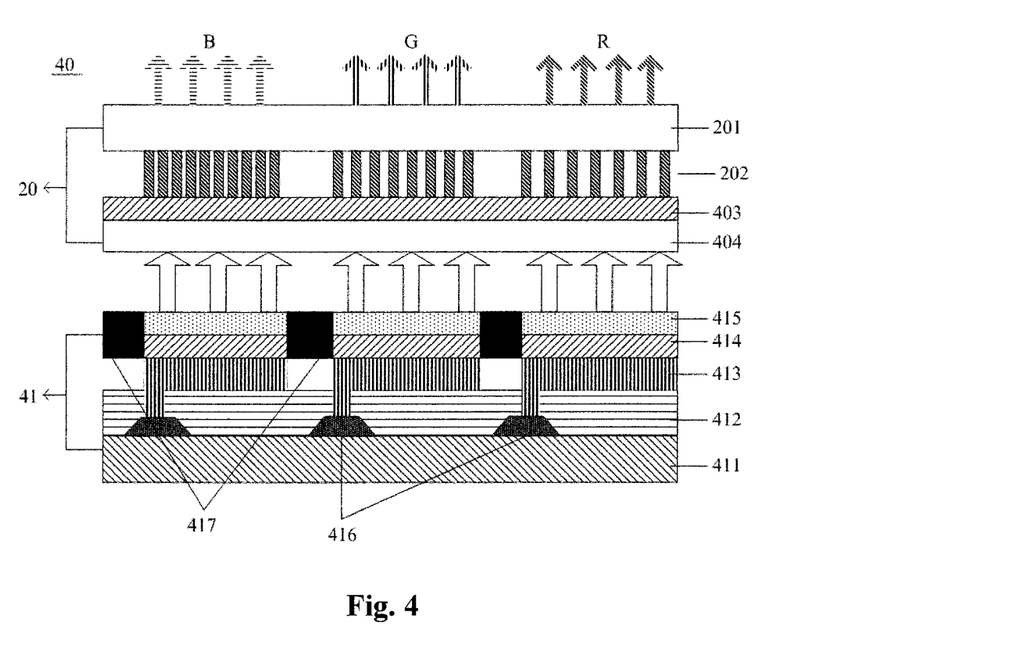
FIG. 4 schematically shows a sectional view of an exemplary display apparatus according to an embodiment of this disclosure.

FIG. 4 schematically shows a sectional view of an exemplary display apparatus 40 according to an embodiment of this disclosure. As shown in FIG. 4, the display apparatus 40 is a top-emission organic electroluminescence display apparatus (OLED). The display apparatus 40 comprises the color filter substrate 20 in the embodiment shown in FIG. 2, and an array substrate 41 provided opposite to this color filter substrate 20. The color filter substrate 20 may further comprise a planarizing layer 403 located on the color filter layer 202 and a transparent electrode 404 located on the planarizing layer 403. The array substrate 41 comprises a substrate 411, a passivating layer 412 and a plurality of thin film transistors (TFTs) 416 located on the substrate 411, a reflective electrode 413 located on the passivating layer 412, a planarizing layer 414 located on the reflective electrode 413, and a white light organic electroluminescence layer 415 located on the planarizing layer 414. The planarizing layer 403 is used for planarizing the color filter layer 202. The passivating layer 412 is used for isolating the TFT 416 and the reflective electrode 413 to prevent interference. The planarizing layer 414 is used for planarizing a reflective electrode layer to facilitate the formation of the white light organic electroluminescence layer 415. The array substrate 41 further comprises black isolation columns 417 to prevent crosstalks between lights of three primary colors R, G, and B. Further, the array substrate 41 also comprises a via hole provided in the passivating layer 412 to connected the TFT 416 and the reflective electrode 413.

In this embodiment, the color filter substrate 20 may comprise a first transmissive grating 203, a second transmissive grating 204, and a third transmissive grating 205 provided on the substrate 201. Current is applied to the white light organic electroluminescence layer 415 to emit white light. White light is transmitted through the first transmissive grating 203, so that red light is filtered through; is transmitted through the second transmissive grating 204, so that green light is filtered through; and is transmitted through the third transmissive grating 205, so that blue light is filtered through. Different currents are applied by corresponding TFTs 416 to control the amount of white light emitted from the white light organic electroluminescence layer 415, so as to control the amounts of red light, green light, blue light which are filtered through, so that full-color display is achieved.

In this embodiment, the top-emission OLED display apparatus uses a transmissive grating which can filter through three primary colors R, G, and B instead of a conventional color filter to achieve the effect of color display, so as to achieve the simplification of the manufacture process steps of color filters, the reduction of the production cost, and the reduction of environmental pollution by ink.

Figure 5:
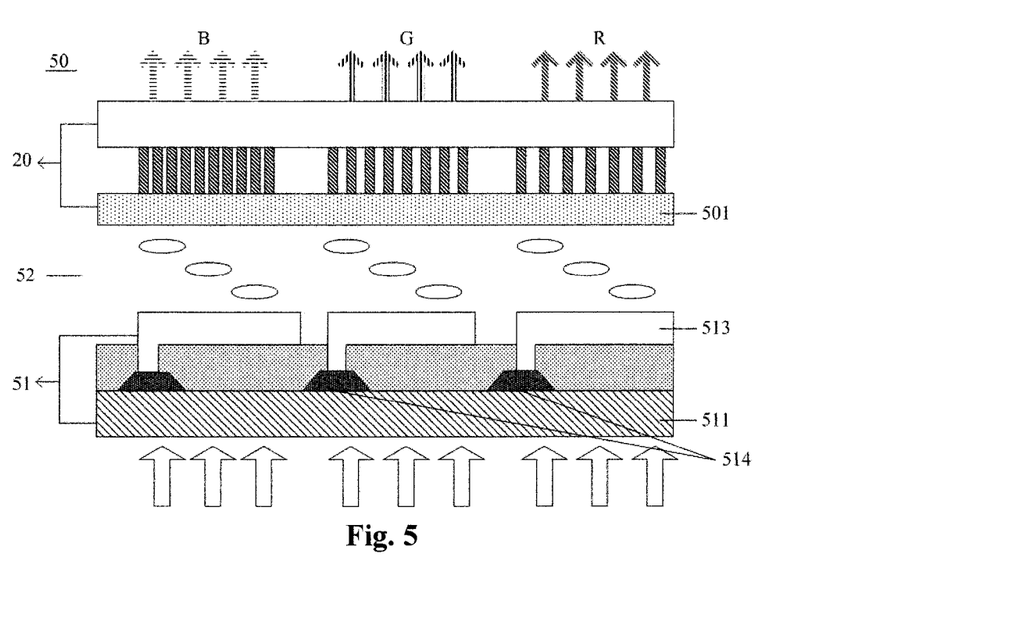
FIG. 5 schematically shows a sectional view of an exemplary display apparatus according to an embodiment of this disclosure.

FIG. 5 schematically shows a sectional view of an exemplary display apparatus 50 according to an embodiment of this disclosure. As shown in FIG. 5, the display apparatus 50 is a liquid crystal display apparatus (LCD). The display apparatus 50 comprises the color filter substrate 20 in the embodiment shown in FIG. 2, an array substrate 51 provided opposite to this color filter substrate 20, and a liquid crystal layer 52 provided between the color filter substrate 20 and the array substrate 51.

It can be understood that the color filter substrate 20 may further comprise a common electrode 501, which is formed on the substrate and is formed from a transparent material such as indium tin oxide (ITO), indium zinc oxide (IZO), etc.

In this embodiment, the array substrate 51 may comprise a plurality of thin film transistors (TFTs) 514 formed on the substrate, and a plurality of pixel electrodes 513, which are in electrical connection with the thin film transistors 514 and are formed from a transparent conductive material such as ITO, IZO, etc.

In this embodiment, the color filter substrate 20 may comprise a first transmissive grating 203, a second transmissive grating 204, and a third transmissive grating 205 provided on the substrate 201. A back light source emits white light. White light is transmitted through the first transmissive grating 203, so that red light is filtered through; is transmitted through the second transmissive grating 204, so that green light is filtered through; and is transmitted through the third transmissive grating 205, so that blue light is filtered through. Different voltages are applied to electrodes by corresponding TFTs 514 to control the arrangement of liquid crystal and control the amount of white light transmitted, so as to control the amounts of red light, green light, blue light which are filtered through, so that full-color display is achieved.

It is to be understood that the display apparatus 50 may further comprise a first polarizer and a second polarizer, which are provided on the color filter substrate 20 and the array substrate 51 respectively.

In this embodiment, the LCD display apparatus uses a transmissive grating which can filter through three primary colors R, G, and B instead of a conventional color filter to achieve the effect of color display, so as to achieve the simplification of the manufacture process steps of color filters, the reduction of the production cost, and the reduction of environmental pollution by ink.

In an embodiment described herein, there is further provided an array substrate, and this array substrate may be used in a display apparatus. When this array substrate is used for a display apparatus, a conventional color filter may be replaced by a transmissive grating to achieve the transmission of three primary colors R, G, and B and achieve full-color display, so as to simplify the manufacture process of color filters, reduce the production cost, and reduce environmental pollution by ink Exemplary array substrates provided in embodiments of this disclosure will now be described in detail with reference to FIGS. 6A and 6B.

Figure 6A:
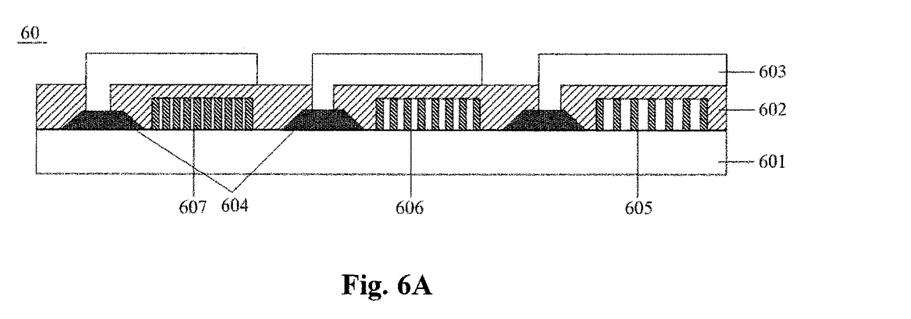
FIG. 6A schematically shows a sectional view of an exemplary array substrate according to an embodiment of this disclosure.
Figure 6B:
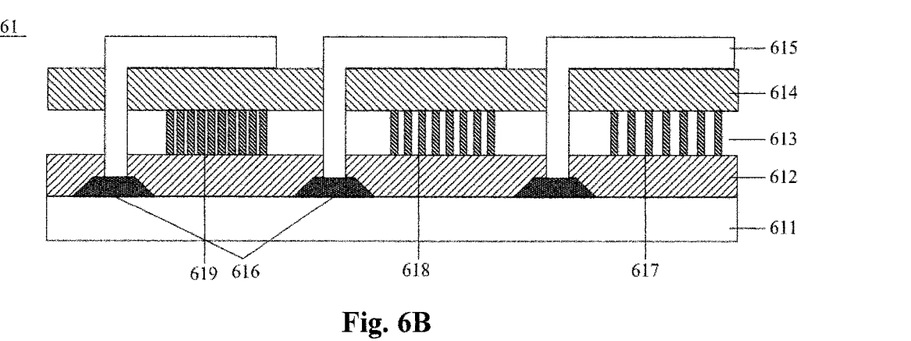
FIG. 6B schematically shows a sectional view of an exemplary array substrate according to an embodiment of this disclosure.

Each of FIGS. 6A and 6B schematically shows a sectional view of an exemplary array substrate according to an embodiment of this disclosure. FIG. 6A schematically shows a sectional view of an exemplary array substrate 60 according to an embodiment of this disclosure. As shown in FIG. 6A, this array substrate 60 comprises a substrate 601, a plurality of thin film transistors (TFTs) 604 located on the substrate 601, a color filter layer located on the substrate 601, a passivating layer 602 located on the substrate 601, and a transparent electrode 603 located on the passivating layer 602. In this embodiment, the color filter layer comprises a transmissive grating, wherein the thin film transistor (TFT) 604 and the transmissive grating are provided in the same layer, and the passivating layer 602 covers the thin film transistor (TFT) 604 and the transmissive grating. In this embodiment, the color filter layer comprises a first transmissive grating 605, a second transmissive grating 606, and a third transmissive grating 607. The first transmissive grating 605 can transmit the component of red light in white light; the second transmissive grating 606 can transmit the component of green light in white light; and the third transmissive grating 607 can transmit the component of blue light in white light. The passivating layer 602 is used for isolating the TFT 604 and the transparent electrode 603 to prevent interference, and is used for planarizing the thin film transistor (TFT) 604 and the transmissive grating provided in the same layer. Further, the array substrate 60 also comprises a via hole provided in the passivating layer 602 to connected the TFT 604 and the transparent electrode 603.

FIG. 6B schematically shows a sectional view of another exemplary array substrate 61 according to an embodiment of this disclosure. As shown in FIG. 6B, this array substrate 61 comprises a substrate 611, a plurality of thin film transistors (TFTs) 616 located on the substrate 611, a passivating layer 612 located on the thin film transistor (TFT) 616 and the substrate 611, a color filter layer 613 located on the passivating layer 612, a planarizing layer 614 located on the color filter layer 613, and a transparent electrode 615 located on the planarizing layer 614. In this embodiment, the passivating layer 612 covers the thin film transistor (TFT) 616 and the substrate 611 so as to planarize the thin film transistor (TFT) 616; and the planarizing layer 614 is used for planarizing the color filter layer 613. Further, the array substrate 61 also comprises a via hole provided in the passivating layer 612, the color filter layer 613, and the planarizing layer 614 to connected the TFT 616 and the transparent electrode 615. In this embodiment, the color filter layer 613 comprises a transmissive grating. Particularly, the color filter layer 613 comprises a first transmissive grating 617, a second transmissive grating 618, and a third transmissive grating 619. The first transmissive grating 617 can transmit the component of red light in white light; the second transmissive grating 618 can transmit the component of green light in white light; and the third transmissive grating 619 can transmit the component of blue light in white light.

Since the substrates, the first transmissive gratings, the second transmissive gratings, and the third transmissive gratings in the embodiments shown in FIGS. 6A and 6B may have the same materials and the same functions as those in the embodiments shown in FIGS. 2 and 3, detailed explanation and description of these components and the arrangements thereof in the embodiments shown in FIGS. 2 and 3 are also suitable for the embodiments shown in FIGS. 6A and 6B, and the description thereof is not repeated in these embodiments.

It can be understood that the array substrate 60 and 61 may further comprise other conventional components desired in operation, for example a polarizer provided on the substrate, in addition to the components shown in FIGS. 6A and 6B. Since these conventional components do not relate to the main concept of this disclosure, detailed description is not provided herein. However, it does not imply that the array substrate described herein does certainly not have these components.

In the array substrate provided in these embodiments, a conventional color filter is replaced by a transmissive grating to filter through three primary colors R, G, and B out of white light, so that the effect of full-color display is achieved. When a color filter film (CF) is conventionally prepared on an array substrate, water vapor and organic substances in a conventional CF adhesive material and the baking temperature of the adhesive material will influence the properties of the TFT. In these embodiments, the transmissive grating is used to replace the color filter process and baking is not required, so that organic gases and water vapor will not be generated and the effect of the process of the color filter on array (COA) on the device can be effectively prevented.

In an embodiment described herein, there is further provided a display apparatus, and this display apparatus can achieve the simplification of the manufacture process steps of color filters, the reduction of the production cost, and the reduction of environmental pollution by ink Exemplary display apparatuses provided in embodiments of this disclosure will now be described in detail with reference to FIGS. 7A-7B and 8A-8B.

Figure 7A:
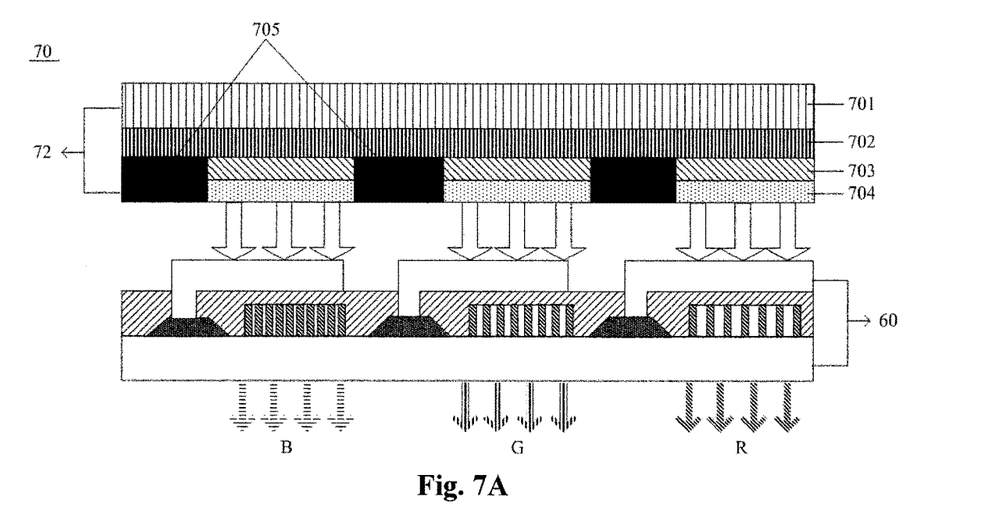
FIG. 7A schematically shows a sectional view of an exemplary display apparatus according to an embodiment of this disclosure.
Figure 7B:
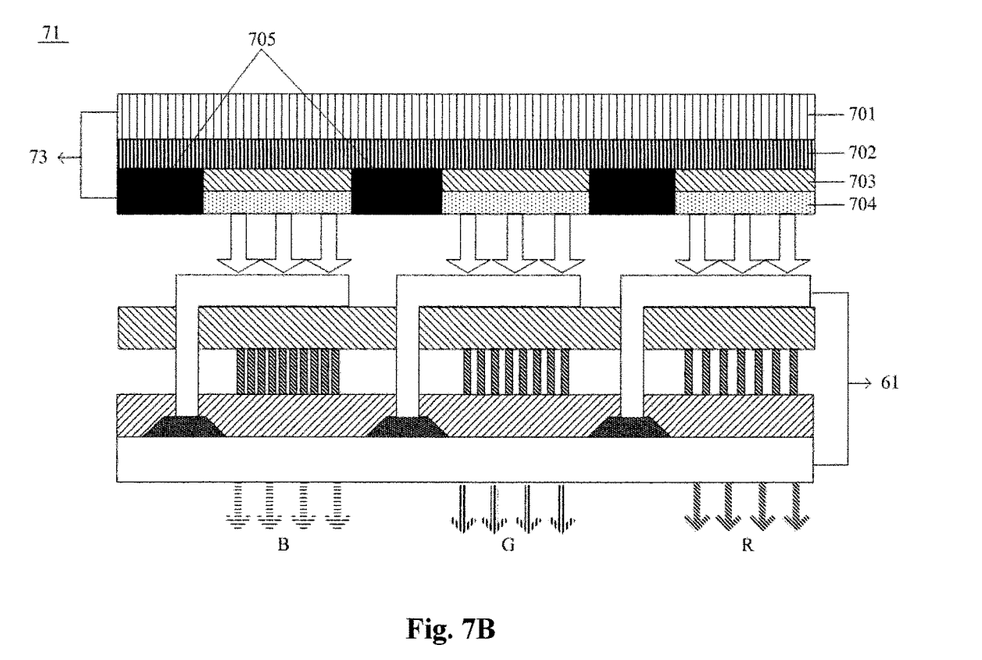
FIG. 7B schematically shows a sectional view of an exemplary display apparatus according to an embodiment of this disclosure.

FIGS. 7A and 7B schematically show sectional views of exemplary display apparatuses 70 and 71 according to embodiments of this disclosure. As shown in FIGS. 7A and 7B, each of the display apparatuses 70 and 71 is a bottom-emission OLED display apparatus. In FIG. 7A, the display apparatus 70 comprises the array substrate 60 in the embodiment shown in FIG. 6A and an opposing substrate 72 provided opposite to this array substrate 60. The opposing substrate 72 comprises a base substrate 701, a reflective electrode 702 located on the base substrate 701, a planarizing layer 703 located on the reflective electrode 702, and a white light organic electroluminescence layer 704 located on the planarizing layer 703. The opposing substrate 72 further comprises black isolation columns 705 to prevent crosstalks between lights of three primary colors R, G, and B. In this embodiment, the planarizing layer 703 is used for planarizing the reflective electrode 702 to facilitate the formation of the white light organic electroluminescence layer 704 on the planarizing layer 703. In FIG. 7B, the display apparatus 71 comprises the array substrate 61 in the embodiment shown in FIG. 6B and an opposing substrate 73 provided opposite to this array substrate 61. The opposing substrate 73 in the embodiment shown in FIG. 7B has the same components and functions as those of the opposing substrate 72 in the embodiment shown in FIG. 7A, and therefore the description thereof is not repeated in the embodiment shown in FIG. 7B.

In this embodiment, each of the array substrates 60 and 61 may comprise a first transmissive grating, a second transmissive grating, and a third transmissive grating provided on the substrate. Current is applied to the white light organic electroluminescence layer to emit white light. White light is transmitted through the first transmissive grating and red light is filtered through; is transmitted through the second transmissive grating and green light is filtered through; and is transmitted through the third transmissive grating and blue light is filtered through. Different currents are applied by corresponding TFTs to control the amount of white light emitted from the white light organic electroluminescence layer so as to control the amounts of red light, green light, blue light which are filtered through, so that full-color display is achieved.

Figure 8A:
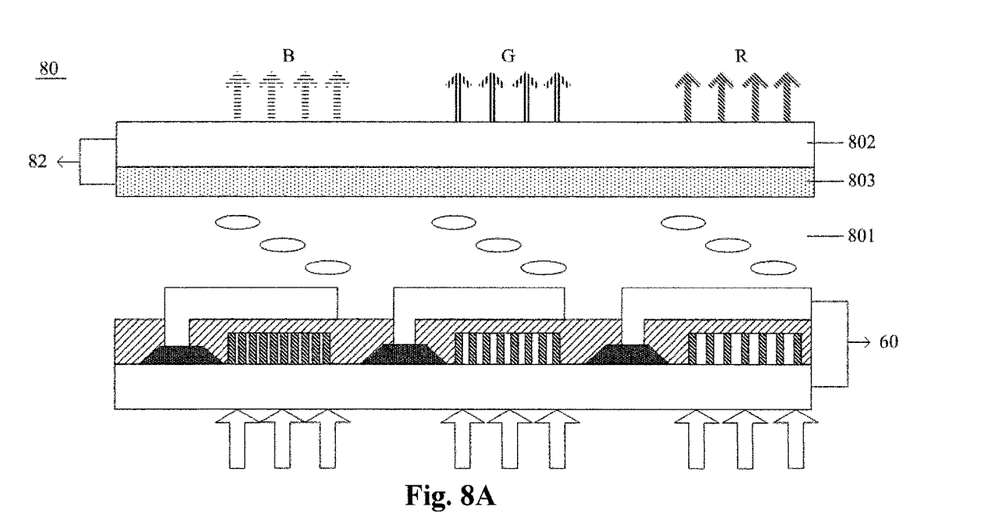
FIG. 8A schematically shows a sectional view of an exemplary display apparatus according to an embodiment of this disclosure.
Figure 8B:
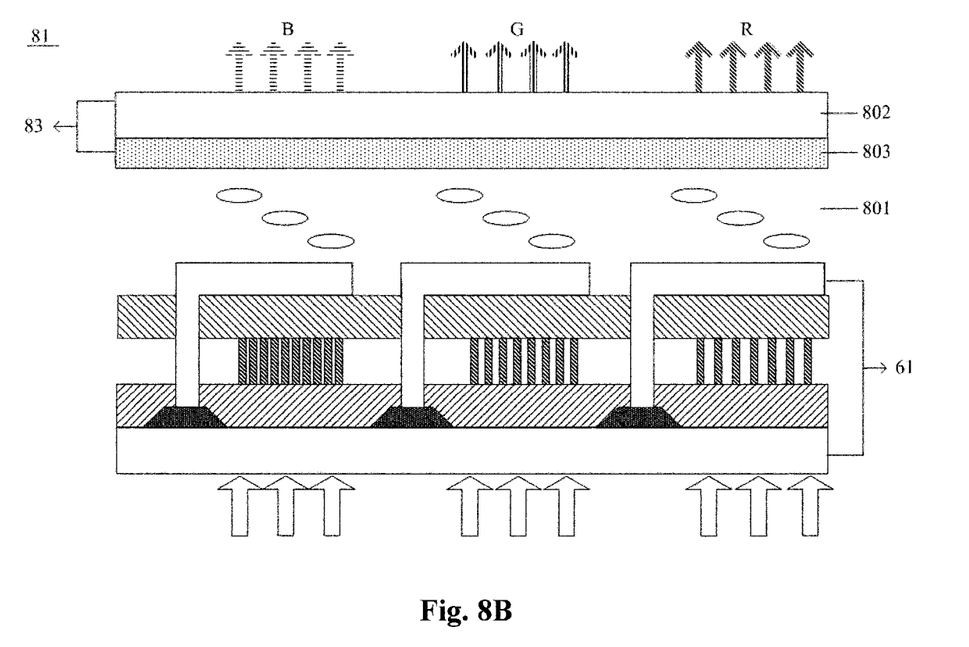
FIG. 8B schematically shows a sectional view of an exemplary display apparatus according to an embodiment of this disclosure.

In this embodiment, the bottom-emission OLED display apparatus uses a transmissive grating which can filter through three primary colors R, G, and B instead of a conventional color filter and thus the component of red light, the component of green light, and the component of blue light are filtered through so as to achieve the effect of color display, so as to achieve the simplification of the manufacture process steps of color filters, the reduction of the production cost, and the reduction of environmental pollution by ink FIGS. 8A and 8B schematically show sectional views of exemplary display apparatuses 80 and 81 according to embodiments of this disclosure. As shown in FIGS. 8A and 8B, each of the display apparatuses 80 and 81 is a LCD display apparatus. In FIG. 8A, the display apparatus 80 comprises the array substrate 60 in the embodiment shown in FIG. 6A, an opposing substrate 82 provided opposite to this array substrate 60, and a liquid crystal layer 801 provided between the opposing substrate 82 and the array substrate 60. It can be understood that the opposing substrate 82 may further comprise a base substrate 802 and a common electrode 803, which is formed on the base substrate 802 and is formed from a transparent material such as indium tin oxide (ITO), indium zinc oxide (IZO), etc. The common electrode 803 and the transparent electrode 603 in FIG. 6A to form a pair of electrodes so as to control the arrangement of liquid crystal in the liquid crystal layer 801. In FIG. 8B, the display apparatus 81 comprises the array substrate 61 in the embodiment shown in FIG. 6B and an opposing substrate 83 provided opposite to this array substrate 61. The opposing substrate 83 in the embodiment shown in FIG. 8B has the same components and functions as those of the opposing substrate 82 in the embodiment shown in FIG. 8A, and therefore the description thereof is not repeated in the embodiment shown in FIG. 8B.

It is to be understood that each of the display apparatuses 80 and 81 may further comprise a first polarizer and a second polarizer, which are provided on the array substrate and the opposing substrate respectively.

In this embodiment, each of the array substrates 60 and 61 may comprise a first transmissive grating, a second transmissive grating, and a third transmissive grating provided on the substrate. A back light source emits white light. White light is transmitted through the first transmissive grating, so that red light is filtered through; is transmitted through the second transmissive grating, so that green light is filtered through; and is transmitted through the third transmissive grating, so that blue light is filtered through. Different voltages are applied to electrodes by corresponding TFTs to control the arrangement of liquid crystal and control the amount of white light transmitted, so as to control the amounts of red light, green light, blue light which are filtered through, so that full-color display is achieved.

In this embodiment, the LCD display apparatus uses a transmissive grating which can filter through three primary colors R, G, and B instead of a conventional color filter to achieve the effect of color display, so as to achieve the simplification of the manufacture process steps of color filters, the reduction of the production cost, and the reduction of environmental pollution by ink.

The aforementioned description of embodiments is provided for the purpose of illustration and description, which are not intended to exhaust or limit this application. Respective elements or features of a specific embodiment are typically not limited to the specific embodiment. However, in a suitable case, these elements and features may be interchangeable and may be used in selected embodiments, even if not specifically shown or described. Likewise, modifications may also be made in many forms. These modifications should not be considered to depart from this application, and all of these modifications are comprised in the scope of this application.

What is claimed is:

1. A color filter substrate, comprising:
a transparent substrate; and
a color filter layer located on the transparent substrate,
wherein the color filter layer comprises a transmissive grating,
wherein the transmissive grating comprises:
a medium array located on the transparent substrate, wherein the medium array is an array consisting of a plurality of blocks provided separately, and each of the blocks consists of a medium main body and a metal layer,
wherein the medium main body comprises:
a lower surface located at a side facing the transparent substrate;
an upper surface located at a side away from the transparent substrate and provided oppositely with respect to the lower surface; and
two opposite side walls;
wherein the metal layer fully covers the upper surface and both side walls of the medium main body, to form a top surface and two side surfaces of the block, wherein each of the side surfaces is perpendicular to the transparent substrate,
wherein the total thickness of the medium main body and the metal layer on the upper surface in the transmissive grating is in a range of 100 nm-200 nm.

2. The color filter substrate according to claim 1, wherein the medium main body comprises PMMA or silicon oxide.

3. The color filter substrate according to claim 1, wherein the metal layer comprises Al, Au, or Ag.

4. The color filter substrate according to claim 1, wherein the medium array of the transmissive grating has a grating period L:

$$L = \frac{\lambda}{((\varepsilon_m * \varepsilon_d)/(\varepsilon_m + \varepsilon_d))^{\frac{1}{2}}}$$

wherein $\varepsilon_m$ is the dielectric constant of the metal, $\varepsilon_d$ is the dielectric constant of the environment outside the metal, and $\lambda$ is the wavelength of transmitted light.

5. The color filter substrate according to claim 1, wherein the transmissive grating comprises a first grating which transmits red light, a second grating which transmits green light, and a third grating which transmits blue light,
wherein the first grating has a grating period in a range of 360-436 nm; the second grating has a grating period in a range of 288-331 nm; and the third grating has a grating period in a range of 262-276 nm.

6. A display apparatus, comprising:
the color filter substrate according to claim 1.

7. The color filter substrate according to claim 1, wherein in a grating period, the sum of the width of the medium main body and the thickness of the metal layer on the side wall constitutes 50% or more of the whole period.

8. An array substrate, comprising:
a transparent substrate;
a thin film transistor located on the transparent substrate; and
a color filter layer, which is located on the transparent substrate and is provided near the thin film transistor in a direction in parallel with the surface of the transparent substrate,
wherein the color filter layer comprises a transmissive grating,
wherein the transmissive grating comprises:
a medium array located on the transparent substrate, wherein the medium array is an array consisting of a plurality of blocks provided separately, and each of the blocks consists of a medium main body and a metal layer,
wherein the medium main body comprises:
a lower surface located at a side facing the transparent substrate;
an upper surface located at a side away from the transparent substrate and provided oppositely with respect to the lower surface; and
two-opposite side walls;
wherein the metal layer fully covers the upper surface and both side walls of the medium main body, to form a top surface and two side surfaces of the block, wherein each of the side surfaces is perpendicular to the transparent substrate,
wherein the total thickness of the medium main body and the metal layer on the upper surface in the transmissive grating is in a range of 100 nm-200 nm.

9. The array substrate according to claim 8, wherein the medium main body comprises PMMA or silicon oxide.

10. The array substrate according to claim 8, wherein the metal layer comprises Al, Au, or Ag.

11. The array substrate according to claim 8, wherein the medium array of the transmissive grating has a grating period L:

$$L = \frac{\lambda}{((\varepsilon_m * \varepsilon_d)/(\varepsilon_m + \varepsilon_d))^{\frac{1}{2}}}$$

wherein $\varepsilon_m$ is the dielectric constant of the metal, $\varepsilon_d$ is the dielectric constant of the environment outside the metal, and $\lambda$ is the wavelength of transmitted light.

12. The array substrate according to claim 8, wherein the transmissive grating comprises a first grating which transmits red light, a second grating which transmits green light, and a third grating which transmits blue light,
wherein the first grating has a grating period in a range of 360-436 nm; the second grating has a grating period in a range of 288-331 nm; and the third grating has a grating period in a range of 262-276 nm.

13. The array substrate according to claim 8, wherein the thin film transistor and the transmissive grating are provided in the same layer.

14. The array substrate according to claim 13, wherein the array substrate further comprises:
a passivating layer, which covers the thin film transistor and the transmissive grating; and
a transparent electrode located on the passivating layer.

15. The array substrate according to claim 8, wherein the thin film transistor and the transmissive grating are not provided in the same layer.

16. The array substrate according to claim 15, wherein the array substrate further comprises:
- a passivating layer, which covers the thin film transistor and the transparent substrate, wherein the transmissive grating is located on the passivating layer;
- a planarizing layer located on the passivating layer; and
- a transparent electrode located on the planarizing layer.

17. The array substrate according to claim 8, wherein in a grating period, the sum of the width of the medium main body and the thickness of the metal layer on the side wall constitutes 50% or more of the whole period.

18. A display apparatus, comprising:
the array substrate according to claim 8.

* * * * *